US012772480B2

(12) United States Patent
Daulton et al.

(10) Patent No.: US 12,772,480 B2
(45) Date of Patent: Oct. 20, 2026

(54) III-NITRIDE VERTICAL HOT ELECTRON TRANSISTOR WITH POLARIZATION DOPING AND COLLIMATED INJECTION

(71) Applicants: Massachusetts Insitute of Technology, Cambridge, MA (US); Brown University, Providence, RI (US)

(72) Inventors: Jeffrey William Daulton, Cambridge, MA (US); Alexander Zaslavsky, Providence, RI (US)

(73) Assignees: Massachusetts Institute of Technology, Cambridge, MA (US); Brown University, Providence, RI (US)

( * ) Notice: Subject to any disclaimer, the term of this patent is extended or adjusted under 35 U.S.C. 154(b) by 578 days.

(21) Appl. No.: 18/229,542

(22) Filed: Aug. 2, 2023

(65) Prior Publication Data

US 2024/0371990 A1 Nov. 7, 2024

Related U.S. Application Data

(60) Provisional application No. 63/413,894, filed on Oct. 6, 2022.

(51) Int. Cl.
*H10D 30/47* (2025.01)
*H10D 62/13* (2025.01)
*H10D 62/85* (2025.01)

(52) U.S. Cl.
CPC ........... *H10D 30/47* (2025.01); *H10D 62/133* (2025.01); *H10D 62/137* (2025.01); *H10D 62/8503* (2025.01)

(58) Field of Classification Search
CPC .... H10D 30/47; H10D 62/133; H10D 62/137; H10D 62/8503; H10D 62/824;
(Continued)

(56) References Cited

U.S. PATENT DOCUMENTS 5,442,194 A * 8/1995 Moise .................. H10D 48/362 257/29
5,949,097 A * 9/1999 Hirata .................... H10D 84/05 257/E29.189

(Continued)

OTHER PUBLICATIONS

Chang et al., "Induced Base Transistor Fabricated by Molecular Beam Epitaxy.", IEEE Electron Device Letters, vol. EDL-7, No. 9, pp. 497-499, Sep. 1986.

(Continued)

*Primary Examiner* — Shahed Ahmed
(74) *Attorney, Agent, or Firm* — Nields, Lemack & Frame, LLC

(57) ABSTRACT

III-nitride-based hot electron transistors (HETs) offer significant promise as high-speed, high-power devices, but their performance has been limited to below that of competing technologies. A HET with collector current density>440 kA/cm$^2$ and common-emitter current gain>75 is disclosed. Polarization engineering of the emitter stack was used to allow for high-current collimated electron injection from the emitter with relatively low turn-on voltage. The use of only polarization charge in the undoped 10 nm-thick base allowed for high gain, through minimization of scattering, with atomic layer etching contact fabrication used to lower base access resistance.

20 Claims, 6 Drawing Sheets

(58) Field of Classification Search
CPC ........ H10D 10/00–891; H10D 84/0107–0109; H10D 89/711–713; H10D 62/812–8181
See application file for complete search history.

(56) References Cited

U.S. PATENT DOCUMENTS

| | | | | |
|---|---|---|---|---|
| 6,201,258 | B1 | 3/2001 | Seabaugh | |
| 6,480,365 | B1 * | 11/2002 | Gill ...................... | G11B 5/3903 360/324.11 |
| 7,956,369 | B2 * | 6/2011 | Reed .................... | H10H 20/818 257/E33.013 |
| 2013/0126825 | A1 * | 5/2013 | Walter ................. | H10H 20/812 438/22 |
| 2016/0315211 | A1 * | 10/2016 | Chandrashekhar ... | H10F 71/121 |
| 2017/0359030 | A1 * | 12/2017 | Obu ..................... | H10D 84/645 |
| 2021/0151623 | A1 * | 5/2021 | Pezeshki .............. | H10H 20/825 |

OTHER PUBLICATIONS

Gupta et al., "Design Space of III-N Hot Electron Transistors Using AlGaN and InGaN Polarization-Dipole Barriers.", IEEE Electron Device Letters, vol. 36, No. 1, pp. 23-25, Jan. 2015.

Gupta et al., "Common Emitter Current Gain >1 in III-N Hot Electron Transistors With 7-nm GaN/InGaN Base.", IEEE Electron Device Letters, vol. 36, No. 5, pp. 439-441, May 2015.

Gupta et al., "Establishment of design space for high current gain in III-N hot electron transistors.", Semiconductor Science and Technology, vol. 33, 6 pages, 2018.

Heiblum et al., "Tunneling hot-electron transfer amplifier: A hot-electron GaAs device with current gain.", Appl. Phys. Lett., vol. 47, pp. 1105-1107, Nov. 1985.

Heiblum et al., "Evidence of Hot-Electron Transfer into an Upper Valley in GaAs.", Phys. Rev. Lett., vol. 56, No. 26, pp. 2854-2857, Jun. 1986.

Hollis et al., "Importance of Electron Scattering with Coupled Plasmon-Optical Phonon Modes in GaAs Planar-Doped Barrier Transistors.", IEEE Electron Device Letters, vol. EDL-4, No. 12, pp. 440-443, Dec. 1983.

Jansen et al., Perpendicular electron transport through a two-dimensional electron-gas layer., Appl. Phys. Lett., vol. 60, pp. 1881-1883, 1992.

Levi et al., "Room-temperature operation of hot-electron transistors. ", Appl. Phys. Lett., vol. 51, pp. 984-986, 1987.

Shur et al., "AlGaN—GaN—AlInGaN induced base transistor.", Appl. Phys. Lett., vol. 76, No. 22, pp. 3298-3300, May 2000.

Yang et al., "Current gain in sub-10 nm base GaN tunneling hot electron transistors with AlN emitter barrier.", Appl. Phys. Lett., vol. 106, 5 pages, 2015.

Yang et al., "Current gain above 10 in sub-10 nm base III-Nitride tunneling hot electron transistors with GaN/AlN emitter.", Appl. Phys. Lett., vol. 108, 4 pages, 2016.

* cited by examiner

III-NITRIDE VERTICAL HOT ELECTRON TRANSISTOR WITH POLARIZATION DOPING AND COLLIMATED INJECTION

This application claims priority of U.S. Provisional Application Ser. No. 63/413,894, filed Oct. 6, 2022, the disclosure of which is incorporated by reference in its entirety.

This invention was made with government support under FA8702-15-D-0001 awarded by the U.S. Air Force. The government has certain rights in the invention.

BACKGROUND

In recent years, GaN high-electron-mobility transistors (HEMTs) have become the primary technological solution for most high-power, high-frequency applications. However, for mm-wave-THz applications, InP heterojunction bipolar transistors (HBTs) have remained the dominant technology due to very high current density and good linearity, resulting in devices performing very close to their theoretical limits. While GaN has many favorable material properties compared to InP, including higher thermal conductivity, higher critical field, and lower dielectric constant, poor hole mobility and difficulties with effective p-type doping has hindered the development of III-nitride-based HBTs.

Research in the 1980s using the III-As material system demonstrated the possibility of an all-electron analog to the HBT, where the conventional electron-hole carrier types were replaced with hot (energetic) and cold (thermalized) electron populations. In the hot-electron transistor (HET), energetic electrons traverse a narrow quantum well base populated with cold electrons and are collected over the base-collector barrier. In principle, given a sufficiently long hot-electron mean-free path, the HET obviates the carrier transit time limitation on device speed, leaving only parasitic limits. Ultimately, the III-As HET work was limited by low injection energies (due to small Γ-L valley energy separation of GaAs) and difficulties with contact formation to narrow base layers. Recent work has recognized the value of revisiting the HET concept in GaN, where the (Γ to M-L) valley energy separation is >6× larger than in GaAs. GaN-based HETs incorporating base doping resulted in working devices with reasonable current density, but relatively low gain, due to impurity scattering in the base. Alternatively, the demonstration of the GaAs induced base transistor without base doping (and hence impurity scattering) led to a similar solution for GaN, taking advantage of the high mobility 2D electron gas (2DEG) that forms spontaneously in AlGaN/GaN heterostructures. However, the resulting devices suffered from relatively low current density and gain, though the gain improved when the base thickness was reduced.

Therefore, a new transistor structure that provided high gain and high current density would be advantageous.

SUMMARY

III-nitride-based hot electron transistors (HETs) offer significant promise as high-speed, high-power devices, but their performance has been limited to below that of competing technologies. A HET with collector current density>440 kA/cm$^2$ and common-emitter current gain>75 is disclosed. Polarization engineering of the emitter stack was used to allow for high-current collimated electron injection from the emitter with relatively low turn-on voltage. The use of only polarization charge in the undoped 10 nm-thick base allowed for high gain, through minimization of scattering, with atomic layer etching contact fabrication used to lower base access resistance.

According to one embodiment, a hot electron transistor (HET) is disclosed. The HET comprises an emitter; a base; a collector; and a tunneling barrier disposed between the emitter and the base, wherein a triangular quantum well is formed adjacent to the tunneling barrier, and is thermionically filled with electrons. In some embodiments, the tunneling barrier comprises aluminum nitride. In some embodiments, the emitter comprises a stack comprising a GaN doped layer adjacent to a surface of a substrate; and a graded AlGaN emitter, comprising a doped portion and a nominally undoped portion, wherein the nominally undoped portion is adjacent to the tunneling barrier. In some embodiments, the triangular quantum well is formed in the nominally undoped portion of the graded AlGaN emitter. In some embodiments, an aluminum concentration of the graded AlGaN emitter at an interface to the GaN doped layer is 0% and is about 15% to about 25% at the interface to the tunneling barrier. In some embodiments, a common-emitter gain β is greater than 30. In some embodiments, a collector current density is greater than 350 kA/cm$^2$. In some embodiments, a 2-dimensional electron gas (2DEG) forms in the base.

According to another embodiment, a hot electron transistor (HET) is disclosed. The HET comprises an emitter stack, comprising a highly doped GaN layer adjacent to a surface of a substrate; and a graded AlGaN emitter comprising a doped portion and a nominally undoped portion; a tunneling barrier comprising AlN, adjacent to the nominally undoped portion; a base comprising undoped GaN; and a collector comprising a wide bandgap material. In some embodiments, a triangular quantum well is formed by polarization fields at an interface of the emitter stack and the tunneling barrier. In some embodiments, a 2-dimensional electron gas (2DEG) forms in the base. In some embodiments, the collector comprises a graded AlGaN base-collector transition layer, wherein grading starts at about 6% and grades up to about 12% ($Al_{0.12}Ga_{0.88}N$) and further comprises a collector layer comprising $Al_{0.12}Ga_{0.88}N$, adjacent to the graded AlGaN base-collector transition layer. In some embodiments, the collector comprises a graded AlGaN base-collector transition layer and a collector layer, wherein a concentration of aluminum in the graded AlGaN base-collector transition layer begins at a concentration less than that of the collector layer and increases to that of the collector layer. In some embodiments, a common-emitter gain β is greater than 30. In some embodiments, a collector current density is greater than 350 kA/cm$^2$. In some embodiments, the doped portion has a n-type doping concentration of more than 1e17 cm$^{-3}$. In some embodiments, the nominally undoped portion has a n-type doping concentration of less than 1e16 cm$^{-3}$. In some embodiments, aluminum in the doped portion has a grading from 0% to at least 13%. In some embodiments, aluminum in the nominally undoped portion has a grading from about 9% to about 22%. In some embodiments, aluminum in the graded AlGaN emitter has a grading from 0% to about 15% to 25%.

BRIEF DESCRIPTION OF THE DRAWINGS

For a better understanding of the present disclosure, reference is made to the accompanying drawings, in which like elements are referenced with like numerals, and in which.

DETAILED DESCRIPTION

A III-N HET device is disclosed, which combines a narrow polarization-doped 2DEG-containing GaN base contacted by a selective low-damage $BCl_3/O_2$ atomic layer etching (ALE) process together with a quantum well injector that provides collimated electron injection into the base. The resulting near-perpendicular transport mitigates gain degradation due to broad electron energy and incident angle distribution, analogous to Landau damping in collisionless plasmas. It also reduces plasmon coupling and probability of phonon emission, leading to a measured common-emitter current gain β>75 and high collector current density $J_C$>440 KA/cm².

Figure 1A:
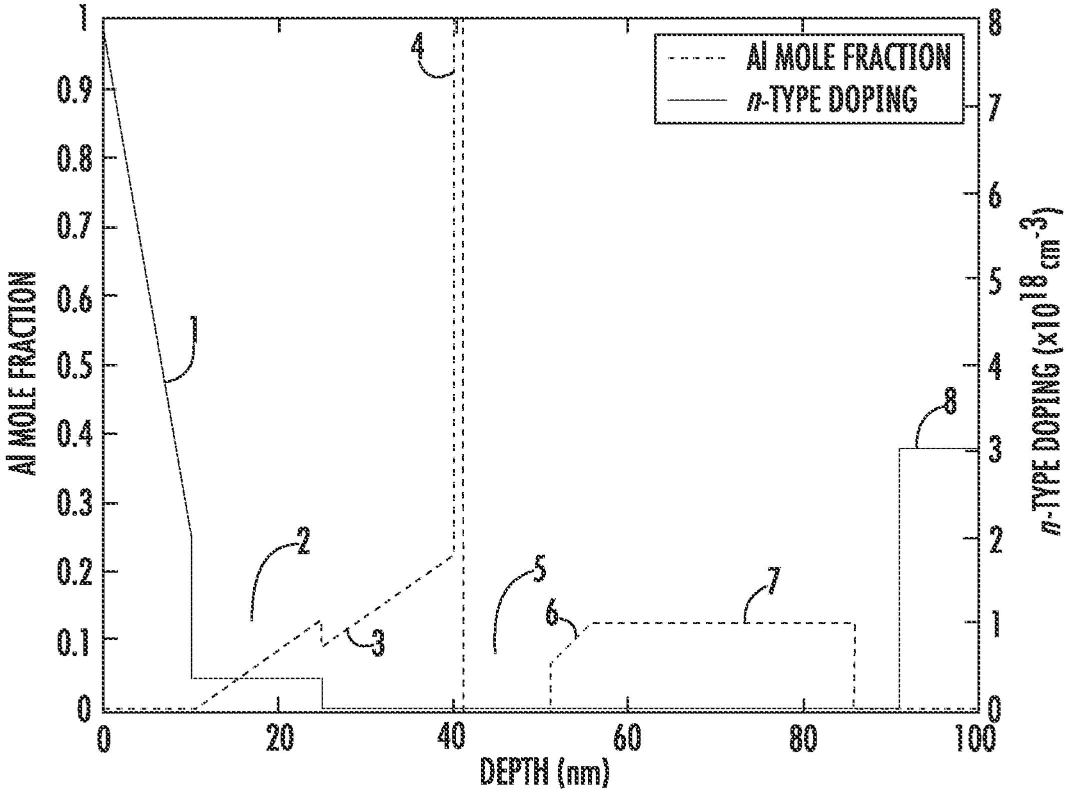
FIG. 1A shows the device structure with Al mole fraction and doping profile.

The epitaxial structure of the transistor is shown in FIG. 1A, including the aluminum content of the AlGaN layers and the donor doping density. It is grown by metal organic chemical vapor deposition (MOCVD) on a 2" sapphire substrate with a 4 μm GaN buffer and an estimated dislocation density of ~$5\times10^8$ cm$^{-2}$ as measured by atomic force microscopy (AFM). The emitter stack includes a highly-doped (~$10^{19}$ cm$^{-3}$, near the practical limit for efficient Si doping in GaN) GaN emitter cap 1 for formation of a low-resistance contact. The emitter cap 1 may include a n-type doping gradient, with the highest doping concentration at the surface of the substrate and decreasing with increasing depth. In certain embodiments, the doping concentration in the emitter cap 1 may be as high as is practical without negatively impacting the material quality too much, as this reduces the emitter contact resistance. The doping gradient used herein ensures high doping density at the surface without exceeding the overall limit for the layer where the material quality would be significantly reduced. The n-type dopant may be silicon. In other embodiments, germanium may be used as the n-type dopant. The doping gradient may be about −6e17 cm$^{-3}$ per nanometer, such that the doping concentration at the surface of the substrate is about 8e18 cm$^{-3}$ and the doping concentration at the bottom of the emitter cap 1 (which is about nm in depth) is about 2-3e18 cm$^{-3}$. The emitter stack also includes a graded AlGaN emitter, which includes a doped portion 2 and a nominally undoped portion 3. The doped portion 2 may be adjacent to the emitter cap 1, and may be about 15 nm thick. The doped portion 2 may have a n-type doping concentration greater than 1e17 cm$^{-3}$, such as about 2-5e17 cm$^{-3}$. Additionally, the concentration of aluminum in the doped portion 2 of the AlGaN emitter may increase from 0% to about 13%, where the percentage is defined as the percentage of moles of aluminum to the total number of moles of aluminum and gallium. The nominally undoped portion 3 is adjacent to the doped portion 2, and may also be about 15 nm thick. Nominally undoped denotes that the doping concentration in this portion is less than 1e16 cm$^{-3}$. The concentration of aluminum in the nominally undoped portion 3 may increase from about 9% to about 22%. Both AlGaN layers of the emitter may include composition discontinuities and the nominally undoped region 3 may be only partially graded, with a portion held at a fixed aluminum composition. More generally, the aluminum concentration of the graded AlGaN emitter begins at 0% at the interface to the emitter cap 1 and increases to a value of about 15% to about 25% at the interface to the AlN tunneling barrier 4. This grading does not need to be linear. In certain embodiments, there may be a discontinuity between the doped portion 2 and the nominally undoped portion 3, such as is shown in FIG. 1A. In other embodiments, the aluminum concentration may reach its maximum value in the nominally undoped portion 3 before contacting the AlN tunneling barrier 4. In this disclosure, the term "about", when used in reference to thickness, doping concentrations or aluminum concentration, is intended to indicate a range that differs from the stated value by +/−20%.

A triangular quantum well 15 (see FIG. 1B) is formed in the nominally undoped region 3 by polarization fields at the interface of the graded AlGaN emitter and an ultrathin AlN tunneling barrier 4, such that these polarization fields overwhelm the field contributions of the bandgap change in the AlGaN achieved by the changing Al fraction. This configuration allows this triangular quantum well 15 to be thermionically filled with electrons arriving into the well from the emitter contact. The AlN tunneling barrier 4 has a thickness of about 1.5 nm. The narrow undoped GaN base 5, which has a thickness of about 10 nm, is designed to contain a 2DEG density of ~$3.5\times10^{12}$ cm$^{-2}$, whereas the collector region includes a graded AlGaN base-collector transition layer 6 to minimize carrier reflection off the collector layer 7, a strategy employed in GaAs-based devices to reduce reflection from an abrupt barrier. The graded AlGaN base-collector transition layer 6 may transition from about 6% to about 12% and may have a thickness of about 5 nm. The collector layer 7, which may be $Al_{0.12}Ga_{0.88}N$, has a thickness of about 30 nm. Note that increased aluminum concentration results in a wider bandgap material. More generally, note that the grading of the graded AlGaN base-collector transition layer 6 begins at an aluminum concentration less than the collector layer 7 and ends at the concentration of the collector layer 7. A $n^+$ subcollector 8 is disposed beneath the collector layer 7. The subcollector 8 may have an n-type doping concentration of about 3e18 cm$^{-3}$ and a thickness of 100 nm or more.

Figure 1B:
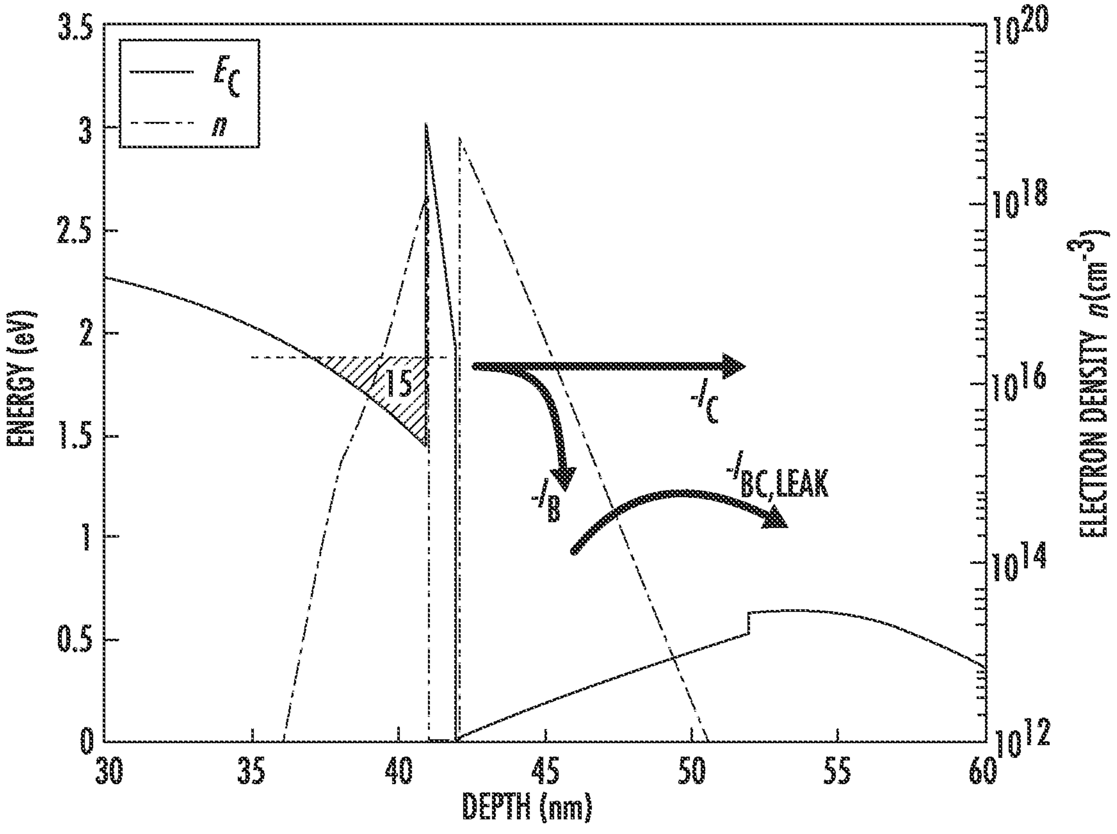
FIG. 1B shows a self-consistent emitter-base conduction band diagram at $V_{BE}$=2 V, $V_{CB}$=2 V, showing electron density and the lowest subband in the emitter (dotted line).

The resulting conduction band diagram is illustrated in FIG. 1B under operating bias conditions ($V_{BE}$=2 V, $V_{CB}$=2 V), including the conduction band energy ($E_c$), the energy of the lowest quantized subband (dashed) in the emitter, together with the predicted electron density (n) in the emitter and base 5 obtained from a self-consistent TCAD simulation. The triangular quantum well 15 is also shown. This quantum well 15 is defined by the area in which the $E_c$ is less than the lowest quantized subband in the emitter. The energy of the lowest quantized subband in the emitter represents the lowest energy where electrons exist in this region, such that electrons injected from the triangular quantum well 15 will come from this energy rather than the conduction band energy.

Figure 1C:
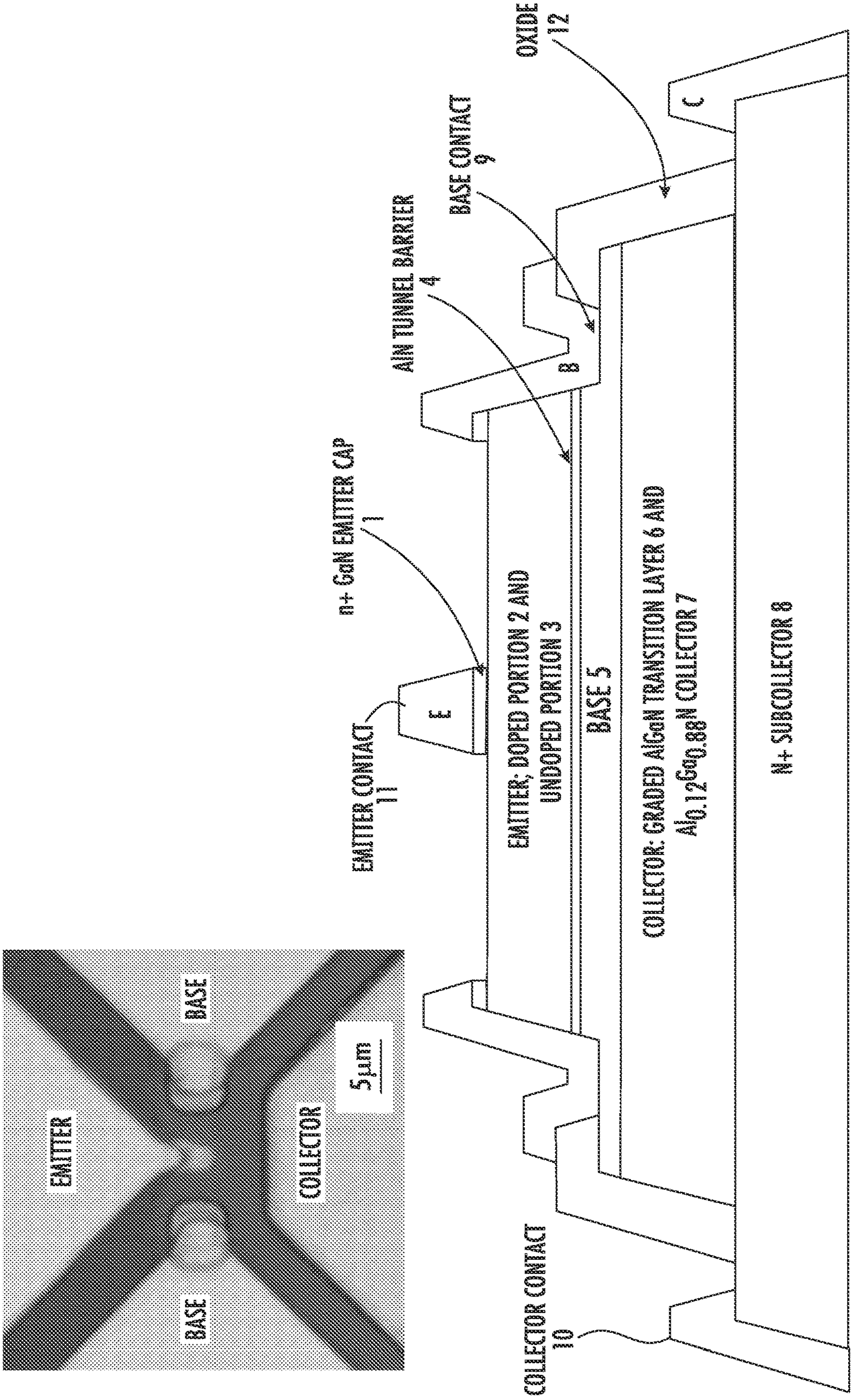
FIG. 1C shows a schematic cross-section of the device. Inset shows top-view photograph of the device.

FIG. 1C shows a cross-section of the transistor structure described above, with a top-view photograph of the device shown in the inset. Fabrication of the transistor structure involves first isolating the active mesa by etching through the AlN tunneling barrier 4, eliminating the base 2DEG outside the device mesa. Base contacts 9 are formed as sidewall contacts to the 2DEG, with base etching accomplished by an atomic layer etching (ALE) process with thermal desorption of reaction products, without any damaging ion bombardment. A metal stack of Ti/Al/Pt is then deposited by Ar sputtering for both base contact 9 and collector contact 10, which are subsequently annealed at 550° C. in forming gas. For the emitter contact 11, a metal of Ti/Pt/Au/Pt is subsequently deposited, bridging over a layer of PECVD $SiO_2$ at the mesa edge to avoid electrical contact to the device sidewall. This $SiO_2$ dielectric layer 12 also extends beyond the physical extent of the probe pads to eliminate the possibility of leakage currents outside the device mesa. Emitter metal is subsequently annealed at 400° C. in forming gas and final pad metal of Ti/Pt/Au is deposited before the $n^+$-GaN emitter cap is removed with the same $BCl_3/O_2$ ALE process (emitter cap etch). A cross-sectional TEM of the sidewall contact are shown in the inset of FIG. 2A.

Figure 2A:
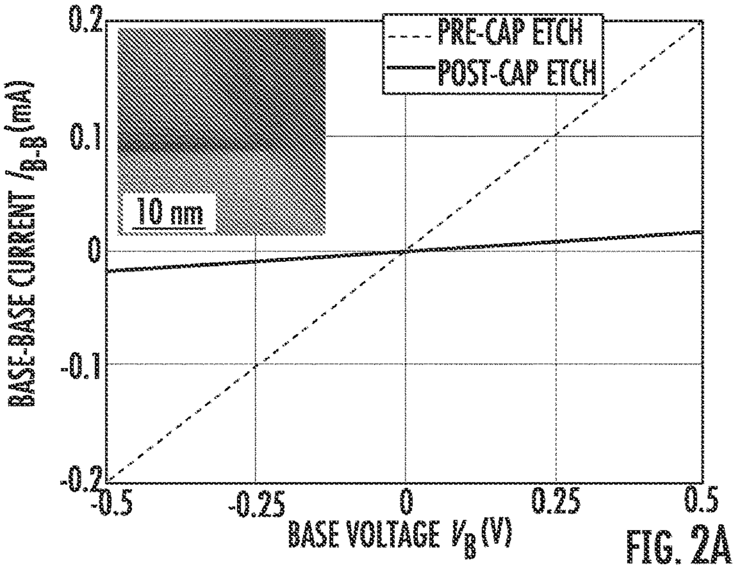
FIG. 2A shows base-to-base I(V) between the two base contacts, before and after the GaN cap etch. Inset shows a cross-sectional dark-field (DF) TEM of the sidewall base contact.

FIG. 2A presents the base-to-base I(V) between the two base contacts (separated by ~7 μm), before and after the $n^+$-GaN emitter cap etch. Prior to the cap etch, the 2DEG per-square resistance is estimated to be ~800 ohms, in good agreement with the simulated 2DEG density of $\sim 3.5\times10^{12}$ $cm^{-2}$ and electron mobility of ~2200 $cm^2/V\cdot s$. This estimate incorporates a contact resistance $R_C$~0.7 ohm-mm, obtained from TLM measurements on GaN HEMT structures grown by similar techniques. The partial cap etch between the metal emitter and base contacts was intended to deplete the mobile carriers in the cap without exposing any AlGaN layers (to avoid Fermi level pinning on surface defects).

Figure 2B:
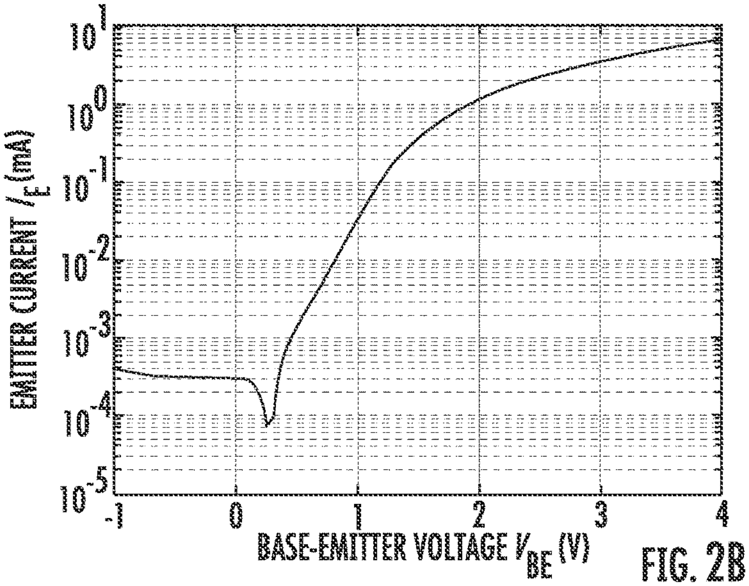
FIG. 2B shows the emitter-base characteristics, with the third terminal floating.
Figure 2C:
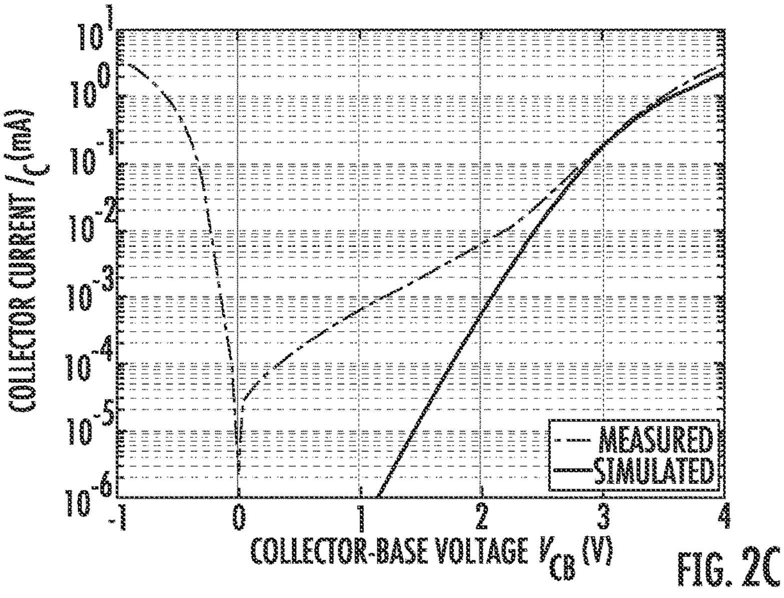
FIG. 2C shows the base-collector characteristics, with the third terminal floating. The additional line indicates the TCAD-simulated thermionic emission base-collector current.

Turning to the HET transistor with a ~1.1×1.2 mm emitter contact and ~3 μm emitter edge to base contact separation, FIGS. 2B-2C show the emitter-base and base-collector diode measurements, respectively, with the other terminal floating. The emitter-base diode in FIG. 2B shows good rectification, with onset of significant current at approximately $V_{BE}$=0.7 V and a current of over 5.5 mA, corresponding to a current density exceeding 5 mA/μm at $V_{BE}$=4 V. The collector-base diode in FIG. 2C also shows rectification, with thermionic current at large $V_{CB}$>2 V (the normal mode of HET operation, see FIG. 1B), agreeing with TCAD simulation shown by the solid line, but considerably larger leakage for lower $0<V_{CB}<2$ V. As discussed below, this added leakage, which is attributed to dislocations, limits the Gummel current gain (at $V_{CB}$=0), but not the common-emitter β at high $V_{CB}$.

Figure 3:
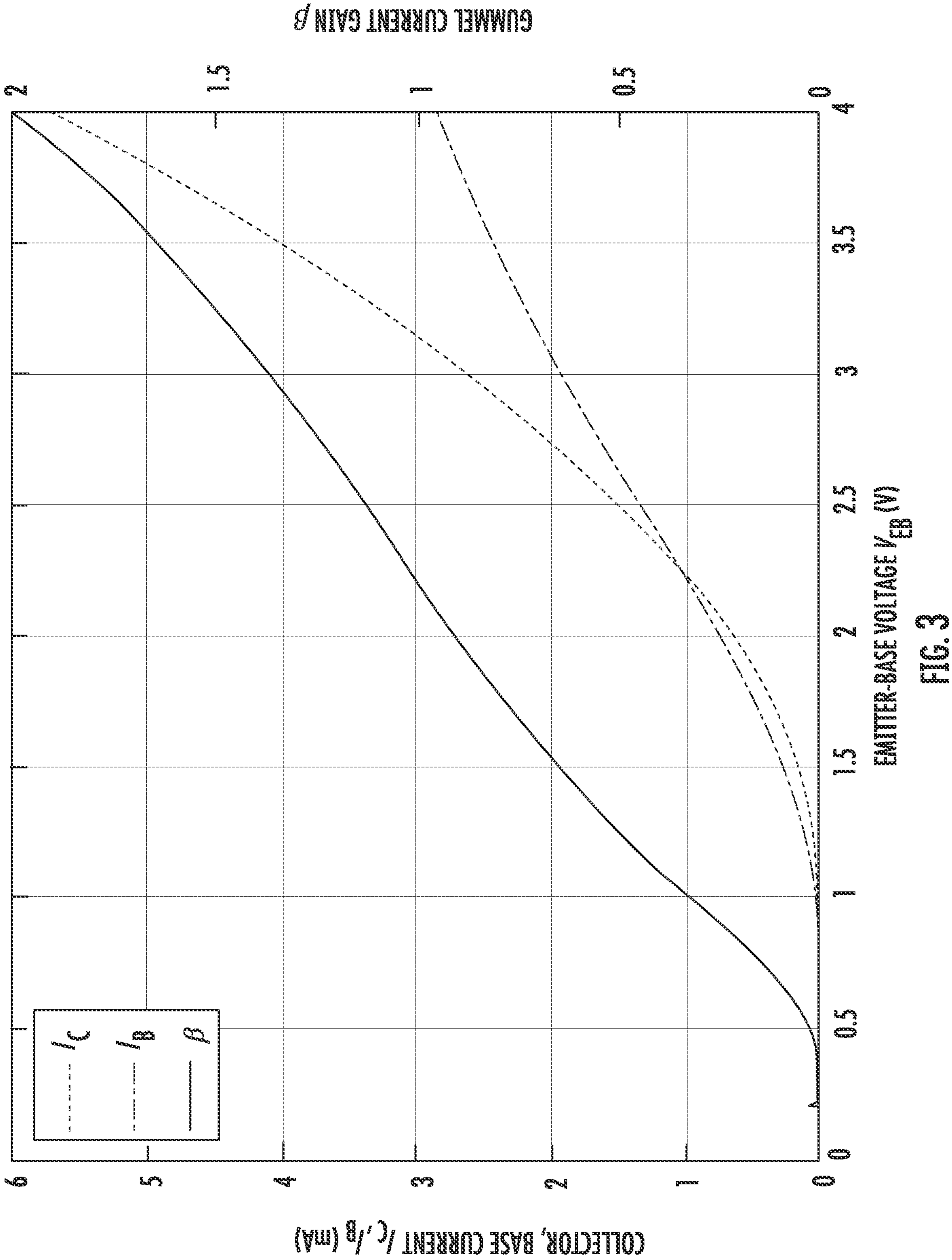
FIG. 3 shows a Gummel plot showing $I_C$, $I_B$ and Gummel current gain β as a function of $V_{BE}$ (emitter area is 1.3 μm²).

The Gummel characteristics are shown in FIG. 3, with a peak Gummel gain β~2 at $V_{BE}$=4 V, with collector current density of 440 $kA/cm^2$. Increasing gain with larger $V_{BE}$ is a function of increased injection energy, which leads to more likely ballistic transport across the base 5 and over the collector barrier. Intervalley electron transfer resulting from injection of electrons above the Γ to M-L energy separation (the intervalley energy separation that may be seen in the band structure of GaN) may be expected to result in degradation of gain at higher $V_{BE}$, but no sharp reduction in Gummel β is observed.

Figure 4A:
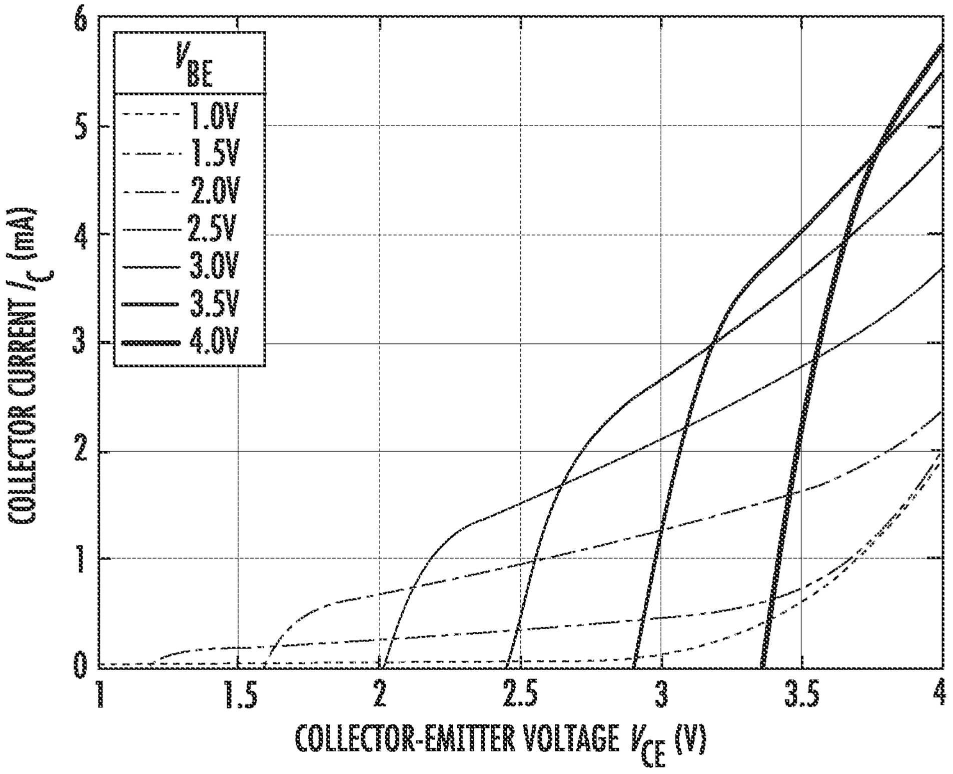
FIG. 4A shows the common-emitter characteristics for $V_{BE}$=1 V to 4 V as a function of $V_{CE}$.
Figure 4B:
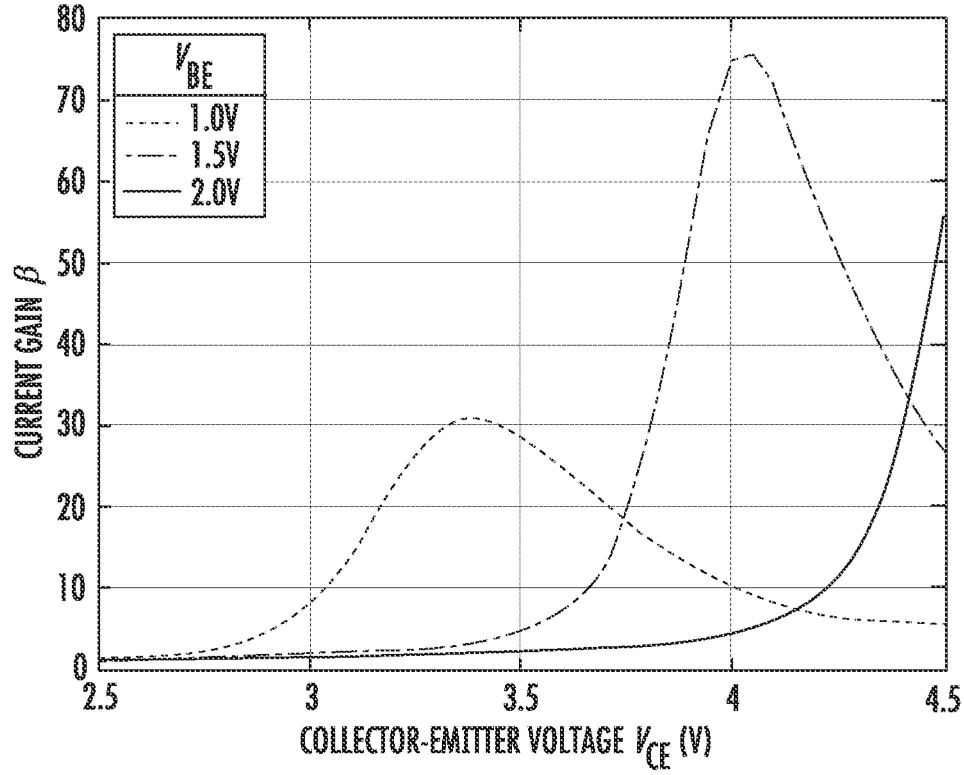
FIG. 4B shows common-emitter current gain β vs. $V_{CE}$ (obtained after subtracting out the base-collector leakage).

The common-emitter HET characteristics as a function of $V_{CE}$ at $V_{BE}$=1 and 1.5 V are shown in FIG. 4. Onset of collector current at large $V_{CB}$ values, consistent with collector barrier lowering below injection energy in 1D band diagram simulation, is expected of ballistic transport of injected hot electrons through the base. Common-emitter gain of >10 at $V_{BE}$=1 V and >75 at $V_{BE}$=1.5 V is observed even after the subtraction of collector-base leakage current of FIG. 2C from the measured $I_C$ to avoid artificially inflating the gain. The collector current density at peak Gummel gain reaches 440 $kA/cm^2$, comparable to the highest-performance InP-based HBTs. Thus, this structure leads to a transistor having a collector current density of more than 350 $kA/cm^2$, and common-emitter gain of greater than 30. The peak transconductance, extracted from these curves, is 310 $kS/cm^2$. High base current, from the combination of high emitter current density and limited gain, results in a substantial voltage drop over the base access region, decreasing effective $V_{BE}$ at the edge of the emitter-base junction. Simulations indicate significant emitter current crowding, as is typical of HBTs, so, in some embodiments, the performance may be improved by fabricating a narrower emitter stripe.

A comparison of these results to previously reported nitride-based HETs is summarized in Table 1. The first four rows refer to four previous publications, entitled "Design space of III-N hot electron transistors using AlGaN and InGaN polarization-dipole barriers", "Current gain in sub-10 nm base GaN tunneling hot electron transistors with AlN emitter barrier", "Current gain above 10 in sub-10 nm base III-Nitride tunneling hot electron transistors with GaN/AlN emitter" and "Establishment of design space for high current gain in III-N hot electron transistors", respectively. Higher common-emitter β, current density and transconductance were observed, despite increased base access resistance due to excessive emitter cap etch and base-collector current leakage at $V_{CB}$<2 V, which is attributed to dislocations, rather than other processes such as sidewall leakage.

TABLE 1

Figures of merit for GaN-based HETs.

| Paper | $J_{C,\,max}$ | $g_{M,\,max}$ | Gummel β | Common-emitter β |
|---|---|---|---|---|
| Gupta 2015 | 2.5 $kA/cm^2$ | — | — | 1.02 |
| Yang 2015 | 62.2 $kA/cm^2$ | 12.4 $kS/cm^2$ | 1.5 | — |
| Yang 2016 | 46.6 $kA/cm^2$ | 30 $kS/cm^2$ | — | 14.5 |
| Gupta 2018 | 2.7 $kA/cm^2$ | — | 3.5 | 3.5 |
| This work | 440 $kA/cm^2$ | 310 $kS/cm^2$ | 2 | 75 |

Figure 5:
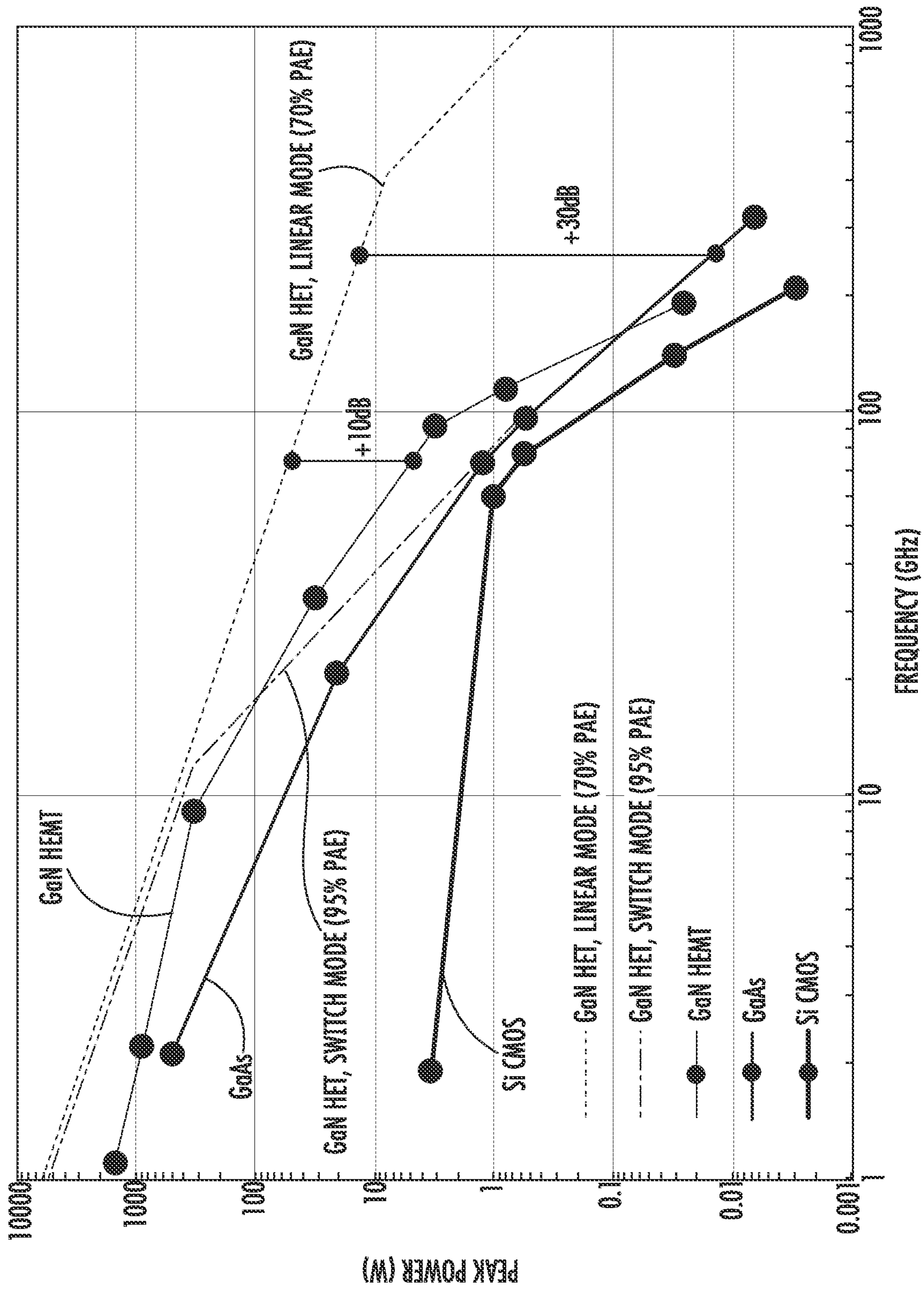
FIG. 5 shows the expected power limits for phase-limited GaN HET with existing current density and voltage, compared to state-of-the-art in other RF device technologies.

FIG. 5 shows the expected power limits for phase-limited GaN HET with existing current density and voltage, compared to state-of-the-art in other RF device technologies. Note that the GaN hot electron transistor exhibits better peak power over a wide range of frequencies.

In addition to miniaturizing the dimensions of the transistor, as in high-performance HBTs, an obvious avenue towards higher performance is the reduction of dislocation density. Conductive dislocations in III-N materials have been shown to exhibit a variety of mid-gap energies, leading to parasitic leakage currents that limit the current gain. These dislocations have also been shown to induce 2DEG nonuniformity, resulting in significant vertical field inhomogeneity. In the context of hot electron injection of FIG. 1B, these leakage currents may come in the form of electrons being injected into the base from below the emitter conduction band, broadening the injected electron distribution, which is not readily distinguishable from scattering within the base region. As the injection energy of electrons coming from dislocations is below the base-collector barrier, these electrons will necessarily contribute to base current, lowering the measured current gain and artificially increasing the apparent scattering rate. Similarly, such dislocations within the base-collector barrier result in increased base-collector leakage evident in FIG. 2C. In some embodiments, the use of bulk substrates, with ~$10^6$ $cm^{-2}$ dislocation densities, may reduce the average dislocation count in a ~1 $\mu m^2$ emitter area to less than 1, eliminating these mid-gap states and allowing clearer determination of the contribution of base scattering. The resulting increased B may reduce voltage drop over the extrinsic base region and increase collector current. Improved thermal conductivity from bulk substrates compared to heteroepitaxial growth may also likely improve current density of the device.

In conclusion, GaN-based HETs with electron injection from a 2D subband in the emitter and good Ohmic contacts to a narrow, polarization-doped GaN base have been fabricated and characterized. The observed collector current density reaches ~440 kA/$cm^2$ and the common-emitter gain reaches 75.

Note that the dimensions, doping concentrations and aluminum fractions of the various layers of the HET described herein are illustrative. The various layers may be fabricated with different dimensions or slightly modified compositions, which may result in a corresponding change in parameters such as common-emitter gain and current density while maintaining the same operational mechanisms. As an example, the AlN tunneling barrier 4 may be thicker than described above, which may result in lower current density, but also lower emitter-base capacitance to maintain similar frequency performance.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited t thereto and that the present disclosure may be beneficially implemented in any number of environments for any number of purposes. Accordingly, the claims set forth below should be construed in view of the full breadth and spirit of the present disclosure as described herein.

What is claimed is:

1. A hot electron transistor (HET), comprising:
an emitter;
a base;
a collector; and
a tunneling barrier disposed between the emitter and the base, wherein a triangular quantum well is formed in the emitter and adjacent to the tunneling barrier, and is thermionically filled with electrons.

2. The HET of claim 1, wherein the tunneling barrier comprises aluminum nitride.

3. The HET of claim 1, wherein the emitter comprises a stack comprising:
a GaN doped layer adjacent to a surface of a substrate; and
a graded AlGaN emitter, comprising a doped portion and a nominally undoped portion,
wherein the nominally undoped portion is adjacent to the tunneling barrier.

4. The HET of claim 3, wherein the triangular quantum well is formed in the nominally undoped portion of the graded AlGaN emitter.

5. The HET of claim 3, wherein an aluminum concentration of the graded AlGaN emitter at an interface to the GaN doped layer is 0% and is about 15% to about 25% at the interface to the tunneling barrier.

6. The HET of claim 1, wherein a common-emitter gain $\beta$ is greater than 30.

7. The HET of claim 1, wherein a collector current density is greater than 350 kA/$cm^2$.

8. The HET of claim 1, wherein a 2-dimensional electron gas (2DEG) forms in the base.

9. A hot electron transistor (HET), comprising:
an emitter stack, comprising:
a highly doped GaN layer adjacent to a surface of a substrate; and
a graded AlGaN emitter comprising a doped portion and a nominally undoped portion;
a tunneling barrier comprising AlN, adjacent to the nominally undoped portion;
a base comprising undoped GaN; and
a collector comprising a wide bandgap material.

10. The HET of claim 9, wherein a triangular quantum well is formed by polarization fields at an interface of the emitter stack and the tunneling barrier.

11. The HET of claim 9, wherein a 2-dimensional electron gas (2DEG) forms in the base.

12. The HET of claim 9, wherein the collector comprises a graded AlGaN base-collector transition layer, wherein grading starts at about 6% and grades up to about 12% ($Al_{0.12}Ga_{0.88}N$) and further comprises a collector layer comprising $Al_{0.12}Ga_{0.88}N$, adjacent to the graded AlGaN base-collector transition layer.

13. The HET of claim 9, wherein the collector comprises a graded AlGaN base-collector transition layer and a collector layer, wherein a concentration of aluminum in the graded AlGaN base-collector transition layer begins at a concentration less than that of the collector layer and increases to that of the collector layer.

14. The HET of claim 9, wherein a common-emitter current gain $\beta$ is greater than 30.

15. The HET of claim 9, wherein a collector current density is more than 350 kA/$cm^2$.

16. The HET of claim 9, wherein the doped portion has a n-type doping concentration of more than 1e17 $cm^{-3}$.

17. The HET of claim 9, wherein the nominally undoped portion has a n-type doping concentration of less than 1e16 $cm^{-3}$.

18. The HET of claim 9, wherein aluminum in the doped portion has a grading from 0% to at least 13%.

19. The HET of claim 9, wherein aluminum in the nominally undoped portion has a grading from about 9% to about 22%.

20. The HET of claim 9, wherein aluminum in the graded AlGaN emitter has a grading from 0% to about 15% to 25%.

* * * * *